United States Patent

[11] 3,551,692

[72] Inventor Yao Tung Yen
Kettering, Ohio

[21] Appl. No. 778,497

[22] Filed Nov. 25, 1968

[45] Patented Dec. 29, 1970

[73] Assignee The National Cash Register Company
Dayton, Ohio
a corporation of Maryland

[54] INSULATED-GATE FIELD-EFFECT TRANSISTOR COUPLING CIRCUITS
20 Claims, 3 Drawing Figs.

[52] U.S. Cl. .......... 307/205, 307/208, 307/221, 307/243, 307/244

[51] Int. Cl. .......... H03k 19/08

[50] Field of Search .......... 307/205, 208, 221, 243, 244

[56] References Cited

UNITED STATES PATENTS

| | | | |
|---|---|---|---|
| 3,082,332 | 3/1963 | Smeltzer et al. .......... | 307/221X |
| 3,252,009 | 5/1966 | Weimer .......... | 307/221 |
| 3,322,974 | 5/1967 | Ahruns et al. .......... | 307/221X |
| 3,393,325 | 7/1968 | Burror et al. .......... | 307/205 |
| 3,497,715 | 2/1970 | Yen .......... | 307/205 |

*Primary Examiner*—John S. Heyman
*Attorneys*—Louis A. Kline, John J. Callahan and Harry W. Barron

ABSTRACT: Insulated-gate field-effect transistor coupling circuits for coupling logic signals between clocked insulated-gate field-effect transistor logic circuits which are located on separate logic arrays are disclosed.

INVENTOR
YAO TUNG YEN
BY Louis A. Kline
John J. Callahan
Glenn W. Bowes
HIS ATTORNEYS INVENTOR
YAO TUNG YEN
BY Louis A Kline
John J. Callahan
Glenn W. Bowes
HIS ATTORNEYS

INSULATED-GATE FIELD-EFFECT TRANSISTOR COUPLING CIRCUITS

BACKGROUND OF THE INVENTION

The coupling of logic signals between clocked stages of insulated-gate field-effect transistor logic circuits which are located on an output logic array and on an input logic array, respectively, has previously been achieved by providing a separate connecting pin for each output stage and for each input stage of the logic circuits. However, implementation of complex logic signals requires a large number of connecting pins when the above-described coupling technique is employed, and this imposes a serious packaging and expensive cost problem on large-scale integrated circuit arrays.

The coupling circuits of the described embodiments substantially reduce the number of connecting pins which are required to provide coupling of logic signals between stages of clocked insulated-gate field-effect transistor logic circuits which are located on separate output and input logic arrays, respectively.

In accordance with preferred embodiments of the invention, there is provided a coupling circuit for causing signals corresponding to the output signals provided by first and second logic stages which are located on a first logic circuit array to be applied as input signals to first and second logic stages which are located on a second logic circuit array. The first logic stage of the first array and the second logic stage of the second array are responsive to first and second clock signals, and the second logic stage of the first array and the first logic stage of the second array are responsive to third and fourth clock signals. Each of the four clock signals includes a single pulse during a given time period, with the pulses of the first and second clock signals occurring during a first part of the given time period and the pulses of the third and fourth clock signals occurring during a second and noncoincident part of the given time period. The trailing edge of the respective first and third clock signal pulses occurs prior to the trailing edge of the respective second and fourth clock signal pulses. The output signal provided by the first logic stage on the first array occurs during the first part of said given time; the output signal provided by the second logic stage on the first array occurs during the second part of the given time; the first logic stage on the second array is responsive to signals appearing at the input thereof during the second part of the given time; and the second logic stage on the second array is responsive to signals appearing at the input thereof during the first part of the given time. The coupling circuit, which is on a predetermined one of the first and second arrays, comprises a common terminal and first and second switching means for connecting the common terminal to the first and second logic stages on the predetermined array. The first switching means is rendered conductive by one of the second and fourth clock signals, and the second switching means is rendered conductive by the other one of the second and fourth clock signals.

BRIEF DESCRIPTION OF THE PREFERRED EMBODIMENTS

Figure 1:
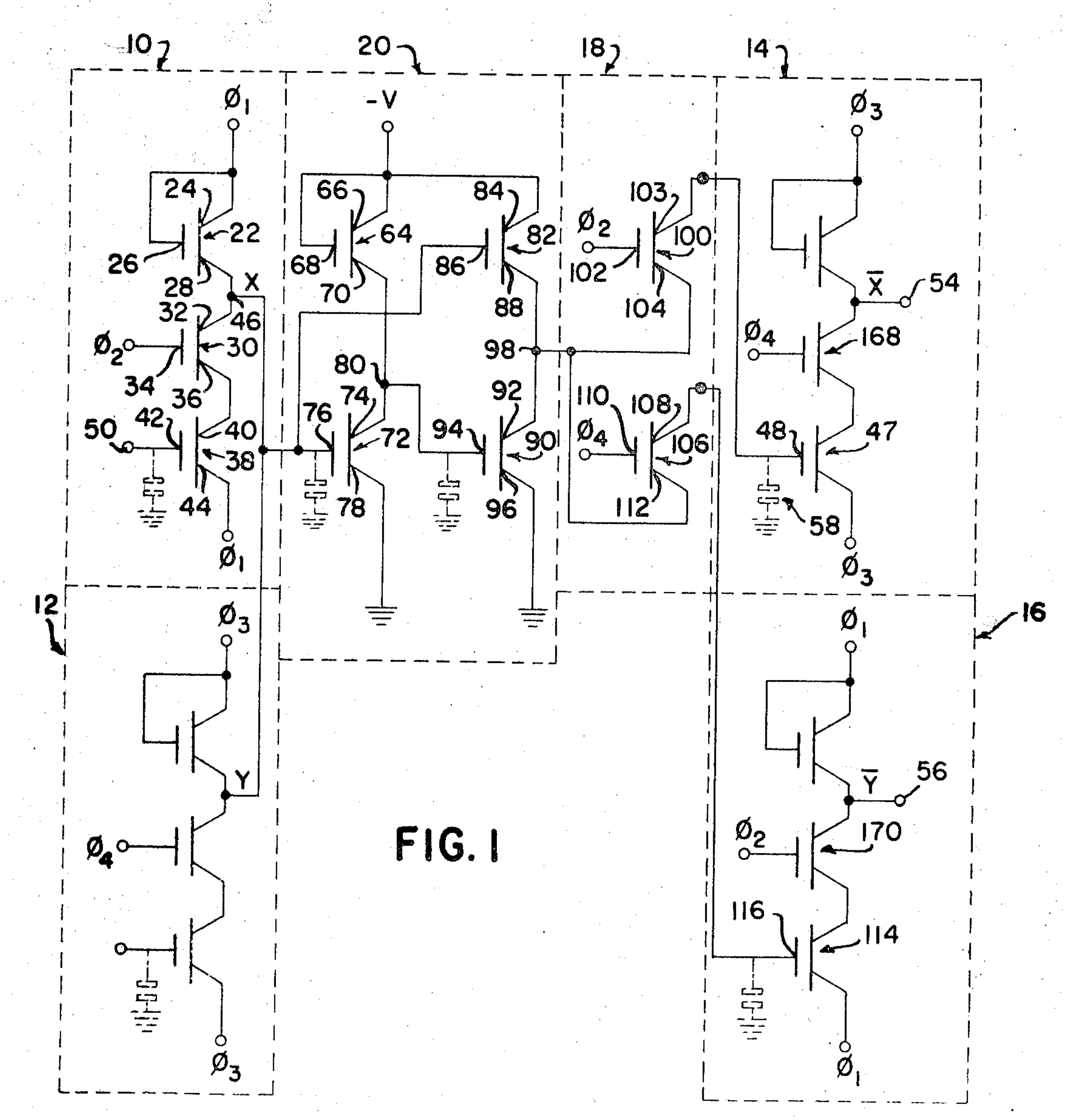
FIG. 1 is a schematic of one embodiment of an insulated-gate field-effect transistor coupling circuit and its associated logic stages.
Figures 2, 3:
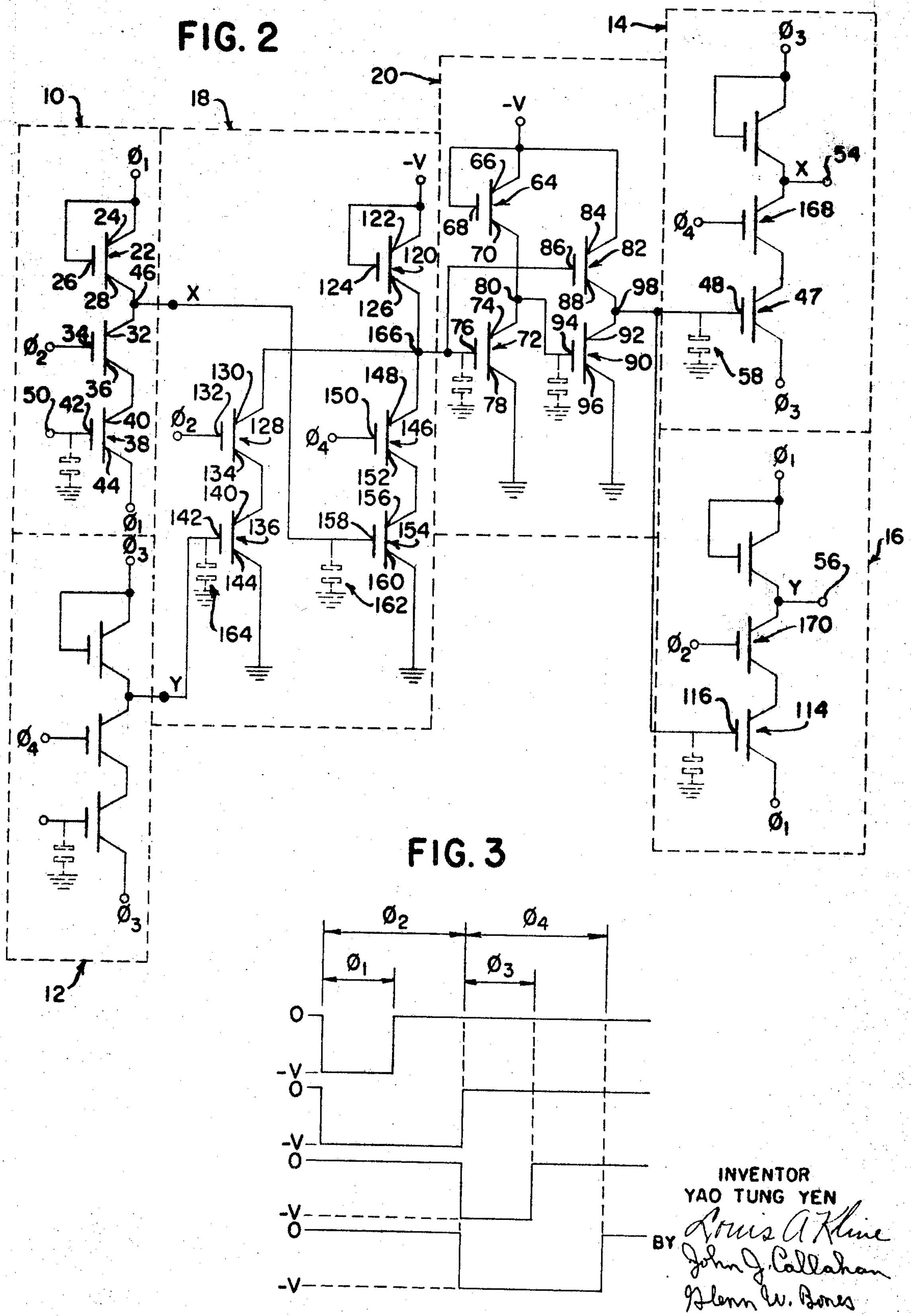
FIG. 2 is a schematic of another embodiment of an insulated-gate field-effect transistor coupling circuit and its associated logic stages.
FIG. 3 is a timing diagram of the four-phase clocking scheme which is employed by the circuits shown in FIGS. 1 and 2.

The logic circuits 10 and 12 of FIGS. 1 and 2 are clocked insulated-gate field-effect transistor logic circuits, and they are the output stages of an array of logic circuits which will be referred to as the "output logic array." The logic circuits 14 and 16 of FIGS. 1 and 2 are also clocked insulated-gate field-effect transistor logic circuits, and they are the input stages of a second array of logic circuits, which will be referred to as the "input logic array."

The four-phase clocking scheme which is shown in FIG. 3 is employed by the logic circuits 10, 12, 14, and 16 in the embodiments of the invention which are shown in FIGS. 1 and 2, each of which embodiments comprises the two output logic stages 10 and 12, the two input logic stages 14 and 16, a coupling circuit 18, and also an amplifier 20, if required. All of the logic circuits 10, 12, 14, and 16 are configurated in a similar manner. The logic circuit 10, for example, has a load transistor 22, which has its drain 24 and its gate 26 interconnected and coupled to receive a clock phase 1 supply voltage ($\Phi_1$), a control transistor 30, which has its drain 32 coupled to the source 28 of the load transistor 22 at the junction point 46, and its gate 34 coupled to receive a clock phase 2 gate voltage ($\Phi_2$), and a logic transistor 38, which has its drain 40 coupled to the source 36 of the control transistor 30, its gate 42 coupled to receive a logic input signal on the input terminal 50, and its source 44 coupled to receive the clock phase 1 supply voltage ($\Phi_1$). The output signal from the logic circuit 10 is taken from the junction point 46 and is an inverted version of the signal applied to the input terminal 50. The logic circuit 16 is identical to the logic circuit 10 and has an input signal applied to the gate 116 of the transistor 114 and an output signal taken from the terminal 56. The logic circuits 12 and 14 differ from the logic circuit 10 in that the clock phase 1 supply voltage ($\Phi_1$) is replaced by the clock phase 3 supply voltage ($\Phi_3$) and the clock phase 2 gate voltage ($\Phi_2$) is replaced by the clock phase 4 gate voltage ($\Phi_4$).

In FIGS. 1 and 2, it is desirable to couple the output signals from the logic circuits 10 and 12 to the inputs of the respective logic circuits 14 and 16. This is done in FIG. 1 by respectively applying the output signals through the amplifier 20 and the coupling circuit 18, and in FIG. 2 by applying the output signals through the coupling circuit 18 and the amplifier 20. When logic signals are transferred from the output logic circuits 10 and 12 to the input logic circuits 14 and 16, respectively, by the coupling circuit 18 of FIG. 1, the logic signal $x$ and $y$, which are implemented by the output logic circuits 10 and 12, respectively, appear on the output terminals 54 and 56 of the input logic circuits 14 and 16 as inverted signals (that is, as $\bar{x}$ and $\bar{y}$, respectively), just as they would appear if the output logic circuits 10 and 12 were directly connected to the input logic circuits 14 and 16, respectively. When logic signals are transferred from the output logic circuits 10 and 12 to the input logic circuits 14 and 16, respectively, by the coupling circuit 18 of FIG. 2, the logic signals $x$ and $y$, which are implemented by the output logic circuits 10 and 12, respectively, appear on the output terminals 54 and 56 of the input logic circuits 14 and 16 as noninverted signals (that is, as $x$ and $y$, respectively).

The capacitance 58, which is connected between the gate 48 of the logic transistor 47 of the input logic circuit 14 and ground, is representative of similar capacitances, which are associated with each of the other transistors of FIGS. 1 and 2 and which are primarily due to the capacitance that exists between the gate and the grounded substrate of the associated transistor because of the manner in which an insulated-gate field-effect transistor is constructed.

The gate-to-substrate capacitance associated with a logic transistor in the described embodiments of FIG. 1 is charged to a voltage which substantially approximates that of a first associated clock phase supply voltage during the period of time that the first associated clock phase supply voltage is at a negative level. For example in FIG. 1 the capacitance 58 will be charged to a negative potential during the time that the clock phase 1 supply voltage ($\Phi_1$) is at a negative level. The gate-to-substrate capacitance may be discharged during the period of time that a second associated clock phase gate voltage is at a negative level and the first associated clock phase supply voltage is at a ground level, according to the logic signal which is to be implemented. For example, the capacitance 58 will be discharged during the period of time that the clock phase 2 gate voltage ($\Phi_2$) is at a negative level and the clock phase 1 supply voltage ($\Phi_1$) is at a ground level if the voltage appearing at the terminal 50 is negative. If the voltage at the terminal 50 is grounded, the capacitor 58 will not discharge. In both FIGS. 1 and 2, the logic signal which is stored in the gate-to-substrate capacitance of a logic transistor may be sampled during the period of time that the next clock phase gate voltage is at a negative level. For example, the logic signal stored in the capacitance 58 may be sampled during the period of time that the clock phase 4 gate voltage ($\Phi_4$) is at a negative level, and the clock phase 3 supply voltage ($\Phi_3$) is at ground.

The amplifier 20 is a noninverting insulated-gate field-effect transistor amplifier which is constructed of transistors physically larger than those employed in the logic circuits 10, 12, 14, and 16, and it may be included when a relatively large amount of stray capacitance exists between the arrays.

The amplifier 20 comprises a load transistor 64, which has its drain 66 and its gate 68 interconnected and coupled to a source of direct current negative voltage, an input transistor 72, which has its drain 74 connected to the source 70 of the load transistor 64 at the junction point 80, its gate 76 connected to receive logic signals that are to be coupled between the logic arrays and its source 78 coupled to ground, a first output transistor 82, which has its drain 84 coupled to the source of direct current negative voltage, and its gate 86 coupled to the gate 76 of the input transistor 72, and a second output transistor 90, which has its drain 92 coupled to the source 88 of the first output transistor 82 at the output junction point 98, its gate 94 connected to the junction point 80, and its source 96 connected to ground.

When a negative voltage (representing a 1 input signal) is applied to the gate 76 of the input transistor 72 and to the gate 86 of the output transistor 82, the transistors 72 and 82 will conduct current, and the drain 74 of the input transistor 72 will, therefore, be substantially at ground, while the source 88 of the output transistor 82 will be at substantially the negative potential of the direct current supply voltage. A ground potential at the gate 94 of the output transistor 90, which is coupled to the drain 74 of the input transistor 72, will prevent current flow through the output transistor 90, and, therefore, a negative voltage (representing a 1 output signal) will appear at the output junction point 98 of the amplifier 20.

On the other hand, when a ground potential (representing a 0 input signal) is applied to the gate 76 of the input transistor 72 and to the gate 86 of the output transistor 82, the transistors 72 and 82 will not conduct current, and the source 70 of the load transistor 64 will apply a negative voltage to the gate 94 of the output transistor 90, which will cause the drain 92 of the output transistor 90 and the output junction point 98 of the amplifier 20 to be substantially at a ground potential (representing a 0 output signal), and, therefore, any capacitance which is coupled to the output junction 98 will be discharged through the output transistor 90 at this time.

The amplifier 20 may, of course, be replaced by other suitable amplifiers, or it may possibly be removed entirely, depending on the external capacitance which is to be driven.

In FIG. 1, the coupling circuit 18 is coupled between the amplifier 20 and the input logic circuits 14 and 16, while in FIG. 2 the corresponding circuit 18 is coupled between the output logic circuits 10 and 12 and the amplifier 20.

The coupling circuit 18 of FIG. 1 comprises a first coupling transistor 100, which has its electrode 103 coupled to the gate 48 of the logic transistor 46 of the input logic circuit 14, its gate 102 coupled to receive the clock phase 2 gate voltage ($\Phi_2$), and its electrode 104 coupled to the output junction point 98 of the amplifier 20, and a second coupling transistor 106, which has its electrode 108 coupled to the gate 116 of the logic transistor 114 of the input logic circuit 16, its gate 110 coupled to receive the clock phase 4 gate voltage ($\Phi_4$), and its electrode 112 coupled to the output junction point 98 of the amplifier 20.

The coupling transistor 100 in the coupling circuit 18 of FIG. 1, therefore, couples the $x$ logic signal, which is implemented by the output logic circuit 10 and which is passed through the amplifier 20, to the gate 48 of the logic transistor 47 of the input logic circuit 14 during the time that the clock phase 2 gate voltage ($\Phi_2$) is at a negative level, and the clock phase 1 supply voltage ($\Phi_1$) is at ground level resulting in a $\bar{x}$ output signal at the output terminal 54 of the logic circuit 14 during the time the clock phase 4 gate voltage ($\Phi_4$) is negative and the clock phase 3 supply voltage ($\Phi_3$) is ground. In the same manner, the coupling transistor 106 in the coupling circuit 18 also couples the $y$ logic signal, which is implemented by the output logic circuit 12 and which is passed through the amplifier 20, to the gate 116 of the logic transistor 114 of the input logic circuit 16 during the time that the clock phase 4 gate voltage ($\Phi_4$) is at a negative level and the clock phase 3 supply voltage ($\Phi_3$) is at ground, resulting in a $\bar{y}$ output signal at the output terminal 56 of the input logic circuit 16 during the time the clock phase 4 gate voltage ($\Phi_4$) is negative and the clock phase 3 supply voltage ($\Phi_3$) is ground.

The coupling circuit 18 of FIG. 2 comprises a load transistor 120, which has its drain 122 and its gate 124 interconnected and coupled to a source of direct current negative voltage, a first control transistor 128, which has its drain 130 connected to the source 126 of the load transistor 120 at the junction point 166, and its gate 132 coupled to receive a clock phase 2 gate voltage ($\Phi_2$), a first input transistor 136, with its drain 140 connected to the source 134 of the first control transistor 128, its gate 142 coupled to the output logic circuit 12 to receive the $y$ logic signal, and its source 144 connected to ground, and a second control transistor 146, which has its drain 148 connected to the source 126 of the load transistor 120 at the junction point 166, its gate 150 coupled to receive a clock phase 4 gate voltage ($\Phi_4$), and a second input transistor 154, which has its drain 156 connected to the source 152 of the second control transistor 146, its gate 158 coupled to the output logic signal, and its source 160 connected to ground.

The coupling circuit 18 of FIG. 2, therefore, couples the $x$ logic signal which is implemented by the output logic circuit 10 to the gate 158 of the second input transistor 154 during the time that the clock phase 2 gate voltage ($\Phi_2$) is at a negative level and the clock phase 1 supply voltage ($\Phi_1$) is at ground. It should be noted that between the time the signal is applied to the gate of the respective logic transistor, 47 and 114, and the time it is sampled, it is stopped in the gate-to-substrate capacitor (e.g., the capacitor 58), which is prevented from discharging by the fact that the coupling transistor 100 or 106, associated therewith, is made nonconductive so that the $x$ logic signal is then represented by the stored charge in the gate-to-substrate capacitance 162 of the second input transistor 154. The stored charge in the capacitance 162 results in a negative voltage being supplied to the gate 158 of the transistor 154 when the applied $x$ logic signal is a 1 and a ground potential being supplied to the gate 158 when the applied $x$ logic signal is a 0. The second control transistor 146 conducts current when the clock phase 4 gate voltage ($\Phi_4$) is at a negative level, and, therefore, when the $x$ logic signal previously coupled from the output logic circuit 10 was a 1, the second input transistor 154 conducts at this time, thereby bringing the output junction point 166 to substantially ground. When the $x$ logic signal previously coupled from the output logic circuit 10 is a 0, the capacitance 162 applies a ground potential to the gate 158 of the second input transistor 154, which prevents the transistor 154 from conducting at this time, thereby bringing the junction point 166 to the negative voltage of the source 126 of the load transistor 120.

The coupling circuit 18 of FIG. 2, therefore, is supplied a $x$ logic signal at a clock phase 2 time, and it produces a $\bar{x}$ signal at the junction point 166 during a clock phase 4 time.

In a similar manner, the $y$ signal from the output logic circuit 12 is represented by the stored charge in the gate-to-substrate capacitance 164 of the first input transistor 136. The stored charge in the capacitance 164 results in a negative voltage being supplied to the gate 142 of the transistor 136 when the applied *y* logic signal is a 1 and a ground potential being supplied to the gate 142 when the applied *y* logic signal is a 0. The second control transistor 128 conducts current when the clock phase 2 gate voltage ($\Phi_2$) is at a negative level, and, therefore, when the *y logic signal previously coupled from the output logic circuit 12 was a* 1, the first input transistor 136 conducts at this time, thereby bringing the junction point 166 to substantially a ground potential, and, when the *y* logic signal previously coupled from the output logic circuit 12 was a 0, the capacitance 164 applies a ground potential to the gate 142 of the first input transistor 136, which prevents the transistor 136 from conducting at this time, thereby bringing the junction point 166 to the negative voltage of the source 126 of the load transistor 120.

The coupling circuit 18 of FIG. 2, therefore, is supplied a *y* logic signal at a clock phase 4 time, and it produces a $\bar{y}$ signal at the junction point 166 during a clock phase 2 time.

The *x* and *y* logic signals are coupled through the amplifier 20 in the embodiment of FIG. 2, in the manner previously described, to the gates 48 and 116 of the logic transistors 47 and 114, respectively, of the input logic circuits 14 and 16, respectively. The control transistor 168 of the input logic circuit 14 is gated into conduction by the clock phase 4 gate voltage ($\Phi_4$), and, therefore, a $\bar{x}$ signal will determine the charge of the capacitance 58, and a *x* logic signal will correspondingly appear on the output terminal 54 of the input logic circuit 14 during the time that the clock phase 4 gate voltage ($\Phi_4$) is at a negative level and the clock phase 3 supply voltage ($\Phi_3$) is at ground level. In a similar manner, the control transistor 170 of the input logic circuit 16 is gated into conduction by the clock phase 2 gate voltage ($\Phi_2$), and a *y* logic signal will, therefore, appear on the output terminal 56 during the time that the clock phase 2 gate voltage ($\Phi_2$) is at a negative level and the clock phase 1 supply voltage ($\Phi_2$) is at ground level.

In the embodiment of FIG. 1, an *x* or a *y* signal supplied from a logic stage 10 or 12 by way of the amplifier 20 and the coupling circuit 18 is stored in the gate-to-substrate capacitance of an insulated-gate field-effect transistor in the logic circuits 14 and 16. For example, in FIG. 1, a *x* logic signal will be stored in the gate-to-substrate capacitance 58 of the insulated-gate field-effect transistor 47 during the time that the clock phase 2 supply voltage ($\Phi_2$) is at a negative level and is sampled during the period of time that the clock phase 4 gate voltage ($\Phi_4$) is at a negative level.

In the embodiment of FIG. 2, an *x* or a *y* logic signal supplied from a logic stage 10 or 12 is stored in the gate-to-substrate capacitance of an insulated-gate field-effect transistor in the coupling circuit 18. For example, in FIG. 2, an *x* logic signal will be stored in the gate-to-substrate capacitance 162 during the time that the clock phase 2 supply voltage ($\Phi_2$) is at a negative level, and may be sampled during the period of time that the clock phase 4 gate voltage ($\Phi_4$) is at a negative level. The sampled *x* logic signal is then applied by way of the amplifier 20 to the logic stage 14.

In the preferred embodiments of FIGS. 1 and 2, all of the transistors are metal-oxide-semiconductor transistors.

I claim:

1. A coupling circuit for causing signals corresponding to the output signals provided by first and second logic stages which are located on a first logic circuit array to be applied as input signals to first and second logic stages which are located on a second logic circuit array, said first logic stage which is on said first array and said second logic stage which is on said second array being responsive to first and second clock signals, said second logic stage which is on said first array and said first logic stage which is on said second array being responsive to third and fourth clock signals, each of said first, second, third, and fourth clock signals including a single pulse during a given time period, said first and second clock signal pulses occurring only during a first part of said given time period, the trailing edge of said first clock signal pulse occurring prior to the trailing edge of said second clock signal pulse, said third and fourth clock signal pulses occurring only during a second part of said given time period which is noncoincident with said first part of said given time period, the trailing edge of said third clock signal pulse occurring prior to the trailing edge of said fourth clock signal pulse, said first logic stage which is on said first array being responsive to said first and second clock signal pulses, so that the output signal provided thereby is provided only during said first part of said given time period, said second logic stage which is on said first array being responsive to said third and fourth clock signal pulses, so that the output signal provided thereby is provided only during said second part of said given time period, said first logic stage which is on said second array being responsive to said third and fourth clock signal pulses, so that an output signal may only be provided thereby in response to a signal appearing at the input thereof during said second part of said given time period, said second logic stage which is on said second array being responsive to said first and second clock signal pulses, so that an output signal may only be provided thereby in response to a signal appearing at the input thereof during said first part of said given time period, said coupling circuit being on a predetermined one of said first and second arrays and comprising:
a common terminal; and
first and second switching means for connecting said common terminal to the first and second logic stages which are on said predetermined array, said first switching means being rendered conductive by one of said second and fourth clock signal pulses and said second switching means being rendered conductive by the other one of said second and fourth clock signal pulses.

2. The invention according to claim 1 wherein signals corresponding to the signals provided by said first and second logic stages which are on said first array appear at said common terminal.

3. The invention according to claim 2 in which said common terminal includes a connecting pin from which signals may be derived in the event said predetermined array is said first array and in which said common terminal includes a connecting pin to which signals may be applied in the event said predetermined array is said second array.

4. The invention according to claim 3 in which the other one of said first and second arrays includes a common terminal connected to each of said first and second logic stages on said other array, and in which signals corresponding to the signals provided by said first and second logic stages which are on said first array appear at said common terminal of said other array.

5. The invention according to claim 1:
wherein said predetermined array is said second array;
wherein said first switching means, when rendered conductive, connects said common terminal to the input of said first logic stage which is on said second array, and said second switching means, when rendered conductive, connects said common terminal to the input of said second logic stage which is on said second array; and
wherein said first switching means is rendered conductive during the existence of said second clock signal pulse and said second switching means is rendered conductive during the existence of said fourth clock signal pulse.

6. The invention according to claim 5 in which the outputs of said first and second logic stages on said first array are coupled together and to said common terminal.

7. The invention according to claim 6:
whereby said first, second, third, and fourth clock signals are four-phase switching signals; and
wherein said first and second logic stages on each of said first and second arrays are four-phase switching circuits which include metal-oxide semiconductor insulated-gate field-effect transistors.

8. The invention according to claim 1:
wherein said predetermined array is said first array;

wherein said first switching means, when rendered conductive, causes to appear at said common terminal a signal which represents a signal which previously had appeared at the output of said first logic stage which is on said first array;

wherein said second switching means, when rendered conductive, causes to appear at said common terminal a signal which represents a signal which previously had appeared at the output of said second logic stage which is on said first array; and wherein said first switching means is rendered conductive during the existence of said fourth clock signal pulse and said second switching means is rendered conductive during the existence of said second clock signal pulse.

9. The invention according to claim 8 in which the inputs of the first and second logic stages on said second array are coupled together and to said common terminal.

10. The invention according to claim 9:

whereby said first, second, third, and fourth clock signals are four-phase switching signals; and wherein said first and second logic stages on each of said first and second arrays are four-phase switching circuits which include metal-oxide semiconductor insulated-gate field effect transistors.

11. The invention according to claim 8:

wherein said first switching means includes first and second semiconductor devices each having a control electrode and two main electrodes, said main electrodes being coupled serially between said common terminal and a point of reference potential, the control electrode of the one of said devices having a main electrode coupled to said common terminal having said fourth clock signal applied thereto, the control electrode of the other of said devices being coupled to the output of said first logic stage on said first array;

wherein said second switching means includes first and second semiconductor devices each having a control electrode and two main electrodes, said main electrodes being coupled serially between said common terminal and a point of reference potential, the control electrode of the one of said devices having a main electrode coupled to said common terminal having said second clock signal applied thereto, the control electrode of the other of said devices being coupled to the output of said second logic stage on said first array; and wherein there is associated with said first and second switching means load means coupled between said common terminal and a source of voltage.

12. In a circuit which includes a pair of input logic stages and a pair of output logic stages, each of said logic stages having inputs and an output, each of said logic stages operating to provide an output signal at said output thereof in response to the application of one of two associated pairs of clock signals and an input signal to said inputs thereof, each clock signal including at least one pulse, the pulse of one of said clock signals of each associated pair of clock signals having a trailing edge occurring prior to the trailing edge of the other one of said clock signals of each associated pair of clock signals, the pulses of any given one of said two associated pairs of clock signals occurring during a unique time during which pulses of the other one of said two associated pairs of clock signals do not occur; a coupling circuit for applying the signal provided at the output of one of said output logic stages to the input of one of said input logic stages and for applying the signal provided at the output of the other of said output logic stages to the input of the other of said input logic stages, wherein said one output and said one input logic stages, said other output and said other input logic stages, said one input and said other input logic stages, and said one output and said other output logic stages are responsive to a different one of said two associated pairs of clock signals, said coupling circuit comprising:

common means;

first means for coupling each of said outputs of said output logic stages to said common means;

second means for coupling each of said inputs of said input logic stages to said common means; and one of said first and second means including a first and a second switching device, said switching devices selectively coupling said outputs of said output logic stages to said common means in the event said switching devices are included in said first means, and said switching devices selectively coupling said inputs of said input logic stages to said common means in the event said switching devices are in said second means, said selective switching occurring in accordance with said two associated pairs of clock signals.

13. The invention according to claim 12 wherein said pair of output logic stages are included in one integrated circuit array and said pair of input logic stages are included in another integrated circuit array.

14. The invention according to claim 13 wherein said common means includes a connecting pin on each array and means interconnecting said pins, whereby the signals provided by said two output logic stages are both applied through said common means and thereafter to the proper one of the input logic stages.

15. The invention according to claim 12 wherein said first and second switching devices are included in said second means, said first switching device causing a signal corresponding to the signal appearing at said common means to appear at the input of said one input logic stage when it is rendered conductive, said second switching device causing a signal corresponding to the signal appearing at said common means to appear at said input of said other input logic stage when it is rendered conductive, said first switching device being rendered conductive by the one of the clock signals having the pulse with the later-occurring trailing edge which is included in said pair of associated clock signals which are applied to said one output logic stage, and said second switching device being rendered conductive by the one of the clock signals having the pulse with the later-occurring trailing edge which is included in said pair of associated clock signals which are applied to said other logic stage.

16. The invention according to claim 15 wherein said pair of output logic stages are included in a logic circuit array, and wherein said switching devices and said pair of input logic stages are included in another integrated circuit array.

17. The invention according to claim 16 wherein said common means includes a connecting pin on each array and a connection therebetween.

18. The invention according to claim 12 wherein said first and second switching devices are included in said first means, said first switching device causing a signal corresponding to the signal appearing at the output of said one output logic stage to appear at said common means during the time said one input logic stage is responsive to a pair of associated clock signals and said second switching device causing a signal corresponding to the signal appearing at the output of said other output logic stage to appear at said common means during the time said other input logic stage is responsive to a pair of associated clock signals.

19. The invention according to claim 12 wherein said pair of input logic stages is included in one logic circuit array, and wherein said pair of output logic stages and said switching devices are included in another logic circuit array.

20. The invention according to claim 19 wherein said common means includes a connecting pin on each logic circuit array and a connection therebetween.